(12) United States Patent
Song

(10) Patent No.: US 11,901,039 B2
(45) Date of Patent: Feb. 13, 2024

(54) MULTIPLE DIFFERENTIAL WRITE CLOCK SIGNALS WITH DIFFERENT PHASES

(71) Applicant: Micron Technology, Inc., Boise, ID (US)

(72) Inventor: Keun Soo Song, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 17/556,570

(22) Filed: Dec. 20, 2021

(65) Prior Publication Data

US 2023/0197129 A1   Jun. 22, 2023

(51) Int. Cl.
| | |
|---|---|
| *G11C 8/00* | (2006.01) |
| *G11C 7/22* | (2006.01) |
| *H03L 7/081* | (2006.01) |
| *G11C 7/10* | (2006.01) |

(52) U.S. Cl.
CPC ............ *G11C 7/222* (2013.01); *G11C 7/1069* (2013.01); *G11C 7/1096* (2013.01); *H03L 7/0818* (2013.01)

(58) Field of Classification Search
CPC .................................................... G11C 7/222
USPC ...................................................... 365/233.1
See application file for complete search history.

(56) References Cited

U.S. PATENT DOCUMENTS

| | | | |
|---|---|---|---|
| 10,109,330 B1* | 10/2018 | Yun .................... | G11C 16/28 |
| 2013/0127503 A1* | 5/2013 | Park ..................... | G11C 7/222 |
| | | | 327/142 |
| 2013/0194881 A1* | 8/2013 | Woo ...................... | G11C 7/00 |
| | | | 365/191 |
| 2018/0005686 A1 | 1/2018 | Oh et al. | |
| 2018/0102151 A1 | 4/2018 | Kim et al. | |
| 2018/0293026 A1* | 10/2018 | Hsieh ..................... | G06F 13/16 |
| 2018/0293190 A1 | 10/2018 | Jang | |
| 2020/0012453 A1 | 1/2020 | Halfen | |
| 2020/0075069 A1* | 3/2020 | Kim ........................ | G11C 7/22 |
| 2020/0202965 A1* | 6/2020 | Merritt ................. | H03L 7/0995 |

OTHER PUBLICATIONS

"International Search Report and Written Opinion", Application No. PCT/US2022/075999, dated Dec. 21, 2022, 10 pages.

* cited by examiner

*Primary Examiner* — Hoai V Ho
(74) *Attorney, Agent, or Firm* — Colby Nipper, PLLC

(57) ABSTRACT

Apparatuses and techniques for operating devices with multiple differential write clock signals having different phases are described. For example, a memory controller (e.g., of a host device) can provide two differential write clock signals to a memory device over an interconnect. The two differential write clock signals may have a phase offset of approximately ninety degrees. Instead of generating its own phase-delayed write clock signals using a component (e.g., a clock divider circuit) that can enter the metastable state, the memory device can use the multiple differential write clocks signals provided by the memory controller to process memory requests.

36 Claims, 10 Drawing Sheets

MULTIPLE DIFFERENTIAL WRITE CLOCK SIGNALS WITH DIFFERENT PHASES

BACKGROUND

A processor executes code based on data to run applications and provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random access memory (RAM) and flash memory, respectively. RAM can include static RAM (SRAM) and dynamic RAM (DRAM).

Demands on the different types of memory continue to evolve and grow. For example, as processors are engineered to execute code faster, such processors can benefit from accessing memories more quickly. Applications may also operate on ever-larger data sets that use ever-larger memories. Due to battery-powered electronic devices and power-hungry data centers, energy-usage constraints are becoming more prevalent for memory systems. Further, manufacturers may seek smaller memories as the form factors of portable electronic device continue to shrink. Accommodating these various demands is thus complicated by the diverse strengths and capabilities of different types of memories.

BRIEF DESCRIPTION OF THE DRAWINGS

Apparatuses of and techniques for using multiple differential write clock signals with different phases are described with reference to the following drawings. The same numbers are used throughout the drawings to reference like features and components.

DETAILED DESCRIPTION

Overview

Figure 1:
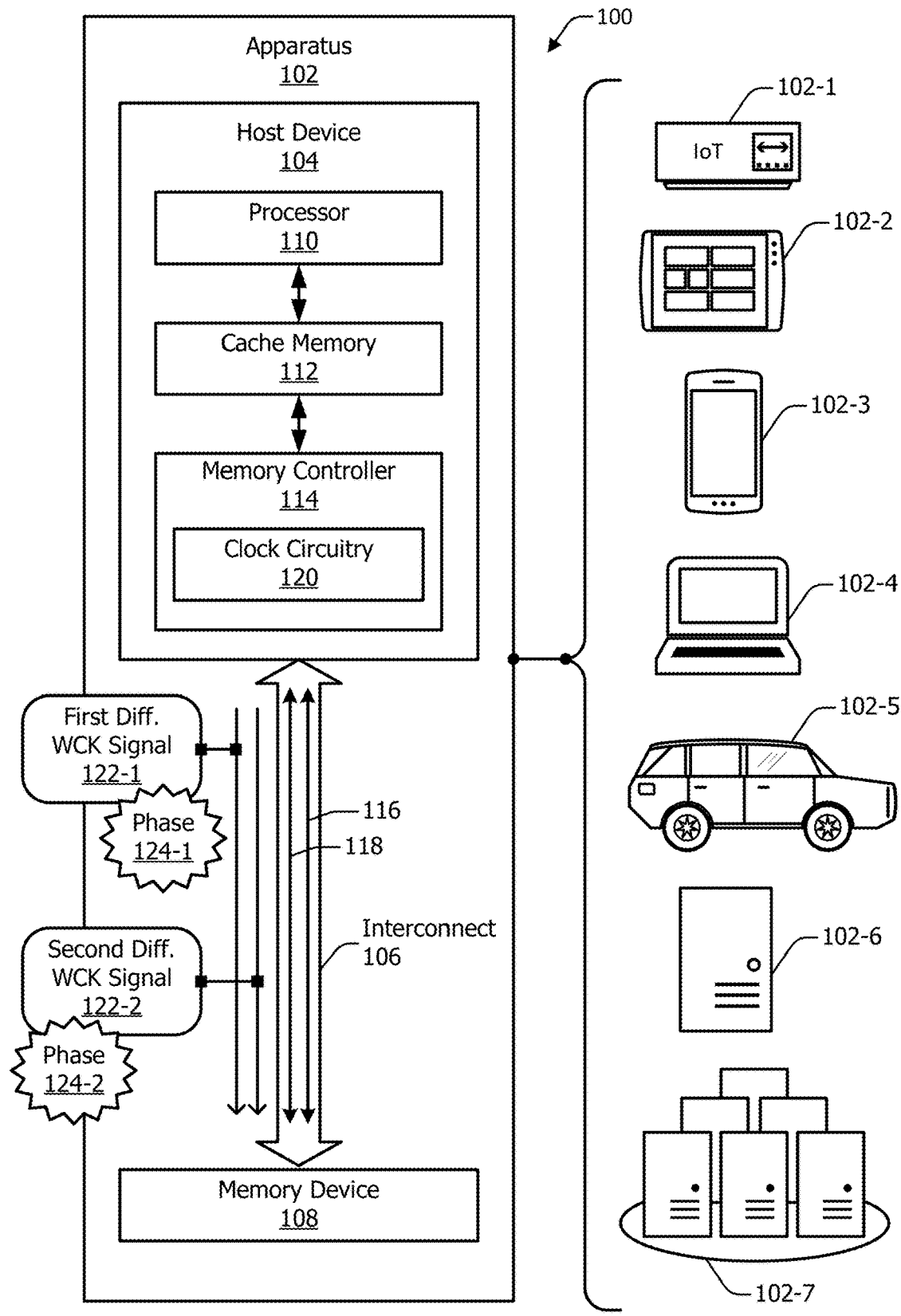
FIG. 1 illustrates example apparatuses that can utilize multiple differential write clock signals with different phases.

Computers, smartphones, and other electronic devices operate using processors and memories to run a variety of programs and applications, ranging from low-power operating systems and background utilities to computationally intensive applications for high-resolution graphics, computer simulations, artificial intelligence (AI), and so forth. Execution speeds associated with these programs and applications are often related to the performance of a memory of the electronic device, which is contingent, in part, on a frequency of clock signals used to enable and coordinate operation of the memory.

By way of review, a memory device may operate based on at least one clock signal that can coordinate when or how data is transferred between a memory controller and the memory device. Some memory systems rely on a single clock signal to synchronize operation between the memory device and the memory controller. Consequently, this clock signal may set the transfer rate of both command-and-address (CA) signals as well as data (DQ) and data strobes (DQS) in synchronous memory systems.

To increase data transfer rates, some memory systems utilize multiple clock signals that can have different frequencies. One command-and-address clock signal (CK) is referenced for transferring the command-and-address signals. Another clock signal, a write or data clock signal (WCK), is referenced for transferring the data strobes. In some cases, the write clock signal can have a higher frequency than the clock signal. These multiple clock signals can enable the memory system to transfer data at a faster rate compared to other memory systems that utilize a single clock. Operating with multiple clock signals, however, can increase power consumption of the memory system.

To conserve power, some techniques cause the memory controller to stop generating the write clock signal when it is not in use. When the memory controller resumes generating the write clock signal, however, components of the memory device may be in a metastable state (e.g., an ambiguous state or an unknown state). This metastable state makes it challenging for the memory device to determine the write clock signal. The memory device can recover from the metastable state based on a static preamble transmitted by the memory controller. In some cases, the static preamble can be transmitted during a leveling operation that synchronizes the write clock signal to the clock signal. However, recovering from the metastable state introduces additional latency into the memory system.

To address this and other issues regarding the metastable state, this document describes aspects of operating devices using multiple differential write clock signals with different phases. Various example aspects, circuits, memory devices, and methods are described herein for enabling metastability-free write clock signaling. In particular, a memory controller (e.g., of a host device) can transmit two differential write clock signals to a memory device over an interconnect. The two differential write clock signals may have a phase offset of approximately 90 degrees. Instead of generating its own phase-delayed write clock signals using a component (e.g., a clock divider circuit) that can enter the metastable state, the memory device can reference the multiple differential write clocks signals transmitted by the memory controller to perform memory operations and/or process memory requests. These techniques enable the memory system to avoid the metastable state when write clock signaling is resumed without introducing additional latency associated with a static preamble.

In some cases, the apparatuses and methods that are described herein may be appropriate for memory that is designed for lower power operations or that is targeted for energy-efficient applications. Thus, the described principles may be incorporated into a low-power memory device or a memory controller that communicates with such a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards or versions thereof, like the LPDDR5 standard, for clarity. The described principles, however, are also applicable to memories that comport with other standards, including other LPDDR standards (e.g., earlier versions or future versions like LPDDR6), and to memories that do not adhere to a public standard.

Example Operating Environments

FIG. 1 illustrates, at 100 generally, example apparatuses 102 that can implement interfacing using multiple differential write clocks with different phases. The apparatus 102 can be realized as, for example, at least one electronic device. Example electronic-device implementations include an internet-of-things (IoTs) device 102-1, a tablet device 102-2, a smartphone 102-3, a notebook computer 102-4 (or desktop computer), a passenger vehicle 102-5, a server computer 102-6, a server cluster 102-7 that may be part of cloud computing infrastructure or a data center, and a portion of such devices (e.g., a printed circuit board (PCB)). Other examples of the apparatus 102 include a wearable device, such as a smartwatch or intelligent glasses; an entertainment device, such as a set-top box, a smart television, or a gaming device; a motherboard or server blade; a consumer appliance; a vehicle or drone, or the electronic components thereof; industrial equipment; a security or other sensor device; and so forth. Each type of electronic device or other apparatus can include one or more components to provide some computing functionality or feature.

In example implementations, the apparatus 102 can include at least one host device 104, at least one interconnect 106, and at least one memory device 108. The host device 104 and/or the memory device 108 may be realized as a system on a chip (SoC). The host device 104 can include at least one processor 110, at least one cache memory 112, and at least one memory controller 114. The processor 110 is communicatively coupled to the cache memory 112, and the cache memory 112 is communicatively coupled to the memory controller 114. The processor 110 is also communicatively coupled, directly or indirectly, to the memory controller 114.

The processor 110 may be implemented as any suitable type of processor, which may include a general-purpose processor, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), a system-on-a-chip, and so forth. In some cases, the processor 110 represents a single processor with multiple processing cores or other resources. The processing cores can be dedicated to different functions, such as modem management, applications, graphics, central processing, or the like.

The memory controller 114 can provide a high-level or logical interface between the processor 110 and at least one memory (e.g., a memory that is external to the host device 104 like the memory device 108). The memory controller 114 can, for example, receive memory requests from the processor 110 and provide the memory requests to the external memory with appropriate formatting, timing, and reordering in accordance with a memory access protocol or specification (e.g., protocols of a Low-Power Double Data Rate 6 (LPDDR6)). The memory controller 114 can also forward to the processor 110 responses to the memory requests that are received from the external memory.

The interconnect 106 provides an interface between the host device 104 and the memory device 108. Using the interconnect 106 the host device 104 and the memory device 108 can communicate with each other. The interconnect 106 can include at least one command-and-address bus 116 and at least one data bus 118. Each bus may be implemented as a unidirectional bus or a bidirectional bus. The interconnect 106 may also include a clock bus that is part of or separate from the command-and-address bus 116. The depicted interconnect 106, as well as other interconnects (not shown) that communicatively couple together various components, enable commands, addresses, and data to be transferred between two or more ones of the various components. Example interconnects include a bus, a switching fabric, one or more wires or traces that carry voltage or current signals, at least one switch, one or more buffers, and so forth.

The memory device 108, which is coupled to the host device 104 using the interconnect 106, can be implemented as any suitable type of memory module, memory die, memory array, memory circuit, or the like. Examples of the memory device 108 include a dynamic random-access memory (DRAM) device or module (e.g., an LPDDR synchronous DRAM (SDRAM)). The DRAM package or module can include a three-dimensional (3D) stacked DRAM device, a high bandwidth memory (HBM) device, or a hybrid memory cube (HMC) device. In general, there are multiple types of DRAM. As one example, a low-power double data rate (DDR) memory, also referred to as LPDDR or mobile DDR, is a DDR SDRAM. LPDDR generally uses less power than other types of DDR SDRAM. In some applications, a SDRAM memory, a LPDDR memory, or other memory may be configurable to operate using multiple differential write clock signals having different phases.

As shown, the memory controller 114 can include clock circuitry 120. The clock circuitry 120 may generate four representations of a write clock signal having 90-degree phase offsets among them. In such cases, the memory device 108 does not need to generate these signals. This allows the memory device 108 to be implemented without components, such as a divider circuit, that could enter the metastable state.

However, it can be challenging for clock circuitry to maintain the 90-degree phase offsets across these four representations of the write clock signal. To reduce the complexity associated with generating the four representations of the write clock signal, the clock circuitry 120 can instead generate two differential write clock signals having different phases. For example, the clock circuitry 120 can generate a first differential write clock signal 122-1 (first diff. WCK signal 122-1) having a first phase 124-1 and a second differential write clock signal 122-2 (second diff WCK signal 122-2) having a second phase 124-2. The second phase 124-2 differs from the first phase 124-1 by, for instance, approximately 90 degrees. As an example, the offset between the first phase 124-1 and the second phase 124-2 can be between 85 and 95 degrees, or between 89 and 91 degrees, or even between 89.5 and 90.5 degrees. In general, the offset is sufficiently close to 90 degrees to enable the memory device 108 to process memory requests and communicate with the memory controller 114 without causing errors.

The first differential write clock signal 122-1 represents a pair of complementary signals. The pair of complementary signals includes a first signal having the first phase and a second signal having a third phase that differs from the first phase 124-1 by approximately 180 degrees. The second differential write clock signal 122-2 also represents a pair of complementary signals. The pair of complementary signals includes a first signal having the second phase and a second signal having a fourth phase that differs from the second phase 124-2 by approximately 180 degrees.

In some aspects, the second differential write clock signal 122-2 represents a delayed version of the first differential write clock signal 122-1. Consider an example in which the first phase 124-1 is approximately zero (0) degrees. In this case, a phase of the first signal of the first differential write clock signal 122-1 is approximately 0 degrees. Also, a phase of the second signal of the first differential write clock signal 122-1 is approximately 180 degrees. As the second phase 124-2 differs from the first phase 124-1 by approximately 90 degrees, the first signal of the second differential write clock signal 122-2 has a phase of approximately 90 degrees. Also, a phase of the second signal of the second differential write clock signal 122-2 is approximately 270 degrees. Generally, the first differential write clock signal 122-1 and the second differential write clock signal 122-2 can have substantially similar frequencies (e.g., the frequencies can differ by less than 10%, 5%, or even 1% of the frequency of the first differential write clock signal 122-1).

The memory controller 114 transmits the first differential write clock signal 122-1 and the second differential write clock signal 122-2 over the interconnect 106 to the memory device 108. The memory device 108 receives the differential write clock signals 122-1 and 122-2 and uses the differential write clock signals 122-1 and 122-2 to process memory requests and/or perform memory operations. For example, the memory device 108 uses the differential write clock signals 122-1 and 122-2 to perform write and/or read operations.

The depicted components of the apparatus 102 represent an example computing architecture with a hierarchical memory system. A hierarchical memory system may include memories at different levels, with each level having a memory with a different speed or capacity. As shown, the cache memory 112 may be logically coupled between the processor 110 and the memory device 108. Although not shown, the hierarchical memory system may include other memories or hierarchical levels. For example, the apparatus 102 may include a cache memory that is coupled between the host device 104 and the memory device 108, may include storage memory that is coupled "below" the memory device 108, and so forth.

Although various implementations of the apparatus 102 are depicted in FIG. 1 and described herein, an apparatus 102 can be implemented in alternative manners. For example, the host device 104 may include multiple cache memories, including multiple levels of cache memory, or may have no cache memory. In some cases, the host device 104 may omit the processor 110 or the cache memory 112.

Also, another memory may have a respective "internal" or "local" cache memory (not shown). Further, the host device 104 may be coupled to multiple memory devices 108. Generally, the illustrated and described components may be implemented in alternative ways, including in distributed or shared memory systems. A given apparatus 102 may also include more, fewer, or different components.

The host device 104 and the various memories may be realized in multiple manners. In some cases, the host device 104 and the memory device 108 can both be disposed on, or physically supported by, a same printed circuit board (PCB) (e.g., a rigid or flexible motherboard). The host device 104 and the memory device 108 may additionally be integrated on a same integrated circuit or fabricated on separate integrated circuits but packaged together. Alternatively, the memory device 108 may be realized as a "separate" physical component relative to that of the host device 104 or the processor 110. Example physical components of the memory device 108, which may be separate from the host device 104, include a printed circuit board, a memory card, a memory stick, or a memory module (e.g., a single in-line memory module (SIMM) or a dual in-line memory module (DIMM)).

A memory may also be communicatively coupled to multiple host devices 104 via one or more interconnects 106 and may be able to respond to memory requests from two or more of the host devices. Each host device 104 may include a respective memory controller 114, or multiple host devices 104 may share a common memory controller 114. An example architecture with at least one host device 104 and multiple processors 110 that are communicatively coupled to a memory device 108 is further described with respect to FIG. 2.

Figure 2:
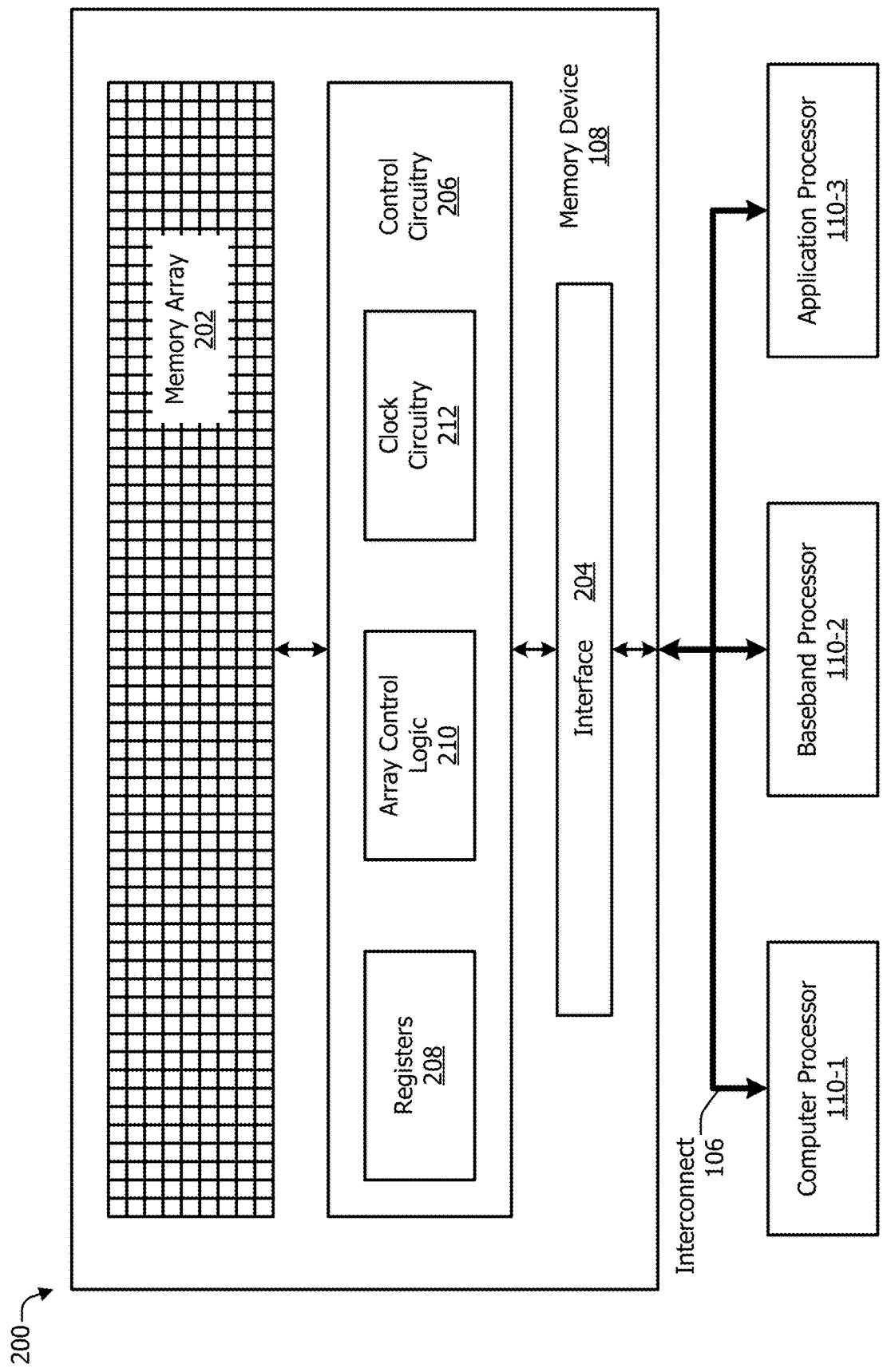
FIG. 2 illustrates example computing systems that can utilize multiple differential write clock signals with different phases.

FIG. 2 illustrates an example computing system 200 that can implement aspects of using multiple differential write clock signals having different phases. In some implementations, the computing system 200 includes at least one memory device 108, at least one interconnect 106, and at least one processor 110. The one or more processors 110 may include a computer processor 110-1, a baseband processor 110-2, and/or an application processor 110-3. These processors may be coupled to the memory device 108 through the interconnect 106. In some implementations, the baseband processor 110-2 may include or be coupled to a modem (not shown in FIG. 2) and may be referred to as a modem processor. The baseband processor 110-2 may be coupled wirelessly to a network via, for example, cellular, Wi-Fi®, Bluetooth®, near field, or another technology or protocol for wireless communication.

In some implementations, the processors 110-1 to 110-3 may be connected directly to the memory device 108 (e.g., via the interconnect 106). In other implementations, one or more of the processors 110-1 to 110-3 may be indirectly connected to the memory device 108 (e.g., over a network connection or through one or more other devices). In this case, the indirect connection may also include the interconnect 106. Further, each processor 110-1 to 110-3 may be realized similarly to the processor 110 of FIG. 1. Accordingly, each processor 110-1 to 110-3 can include or be associated with a memory controller, like the memory controller 114 depicted in FIG. 1. Alternatively, two or more of the processors 110-1 to 110-3 may access the memory device 108 using a shared or system memory controller 114.

The memory device 108 can represent memory that is external to the host device 104 (e.g., external memory) or memory that is internal to the host device 104 (e.g., internal memory, the cache memory 112, or other storage memory (not shown)). The memory device 108 can include, or be associated with, at least one memory array 202, at least one interface 204 (e.g., a memory interface), and control circuitry 206 that is communicatively coupled to the memory array 202.

The memory array 202 can include an array of memory cells, including but not limited to memory cells of Dynamic Random-Access Memory (DRAM), Synchronous DRAM (SDRAM), three-dimensional (3D) stacked DRAM, Double Data Rate (DDR) memory, or Low-Power DDR (LPDDR) SDRAM. The memory array 202 and the control circuitry 206 may be components on a single semiconductor die or on separate semiconductor dies. The memory array 202 and/or the control circuitry 206 may also be distributed across multiple dies. The interface 204 can couple the control circuitry 206 or the memory array 202 directly or indirectly to the interconnect 106.

The control circuitry 206 can include any number of components that can be used by the memory device 108 to perform various operations (e.g., communicate with other devices, manage performance, and perform memory read or write operations). For example, the control circuitry 206 can include one or more registers 208, at least one instance of array control logic 210 (or logic circuitry), and clock circuitry 212. The registers 208 may be implemented, for example, as one or more registers that can store information to be used by the control circuitry 206 or another part of the memory device 108. The array control logic 210 may be implemented as circuitry that can provide command decoding, address decoding, input/output functions, amplification circuitry, power supply management, power control modes, and other functions.

The clock circuitry 212 may be implemented as circuitry that can provide synchronization of various components of the memory device 108 with one or more external clock signals that may be provided over the interconnect 106. An example external clock signal includes a clock signal (CK) or a command-and-address clock signal (e.g., CK_t and CK_c). Another example external clock signal includes a write clock signal or a data clock signal (WCK) (e.g., the first differential write clock signal 122-1 and the second differential write clock signal 122-2). The clock circuitry 212 can also generate at least one internal clock signal based on one or more of the external clock signals.

As shown in FIG. 2, the registers 208, the array control logic 210, and the clock circuitry 212 can be part of a single component (e.g., the control circuitry 206). In other implementations, one or more of the registers 208, the array control logic 210, or the clock circuitry 212 may be implemented as separate components, which can be provided on a single semiconductor die or disposed across multiple semiconductor dies. These components of the control circuitry 206 may be individually or jointly coupled to the interconnect 106 via the interface 204. The techniques of using multiple differential write clock signals having different phases are described further in the following section.

Example Techniques and Hardware

Figure 3:
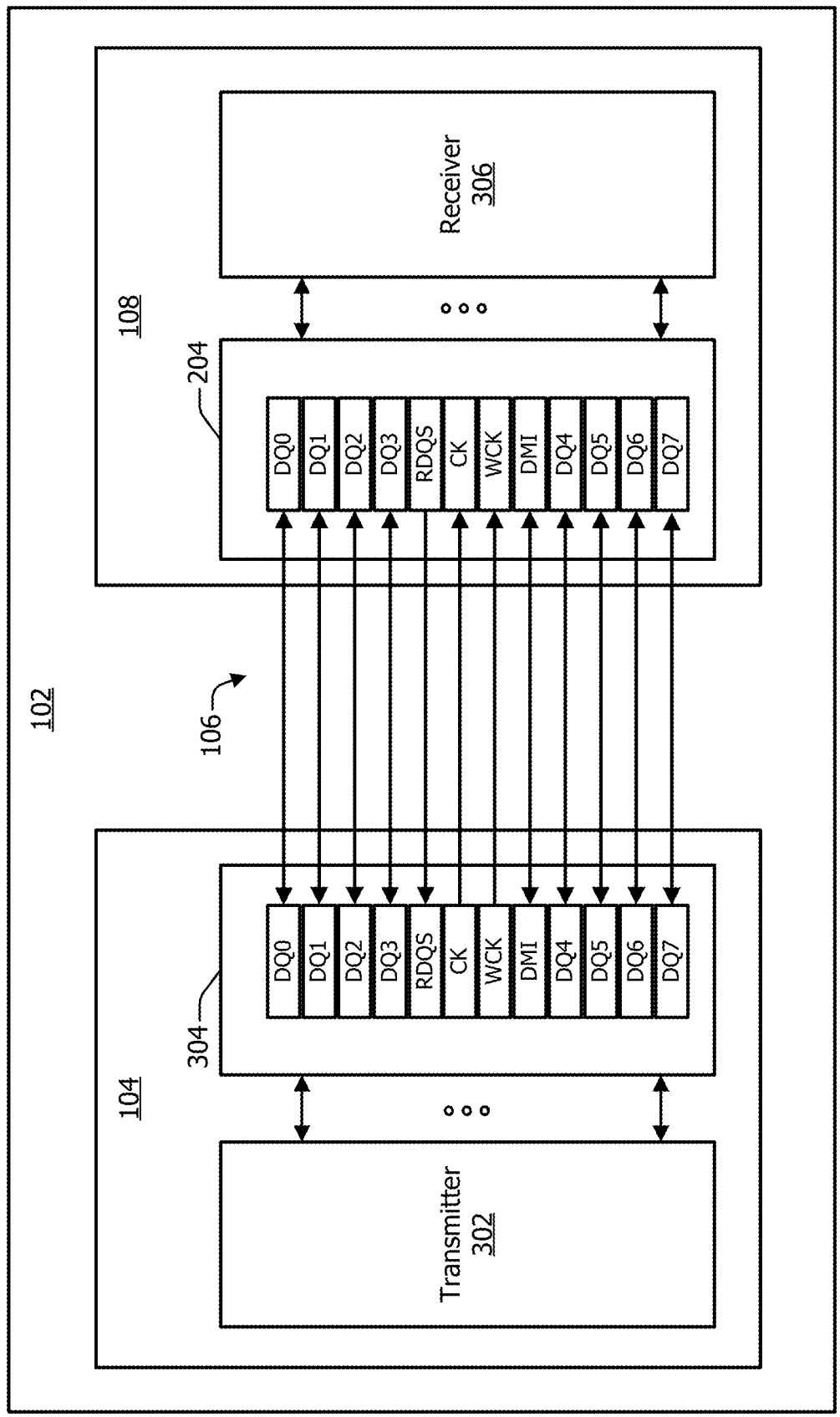
FIG. 3 illustrates examples of a host device, an interconnect, and a memory device that respectively transmits, propagates, and receives multiple differential write clock signals having different phases.

FIG. 3 illustrates examples of a host device 104, an interconnect 106, and a memory device 108 that respectively transmits, propagates, and receives multiple differential write clock signals having different phases. In the depicted configuration, the host device 104 includes a transmitter 302 and an interface 304 (e.g., a host interface). The transmitter 302 may be of any type, such as a finite impulse response (FIR) filter or similar. The transmitter 302 may include or be coupled to any number of data lines for reading or writing data. The transmitter 302 is coupled to the interconnect 106 via the interface 304.

The memory device 108 includes the interface 204 and a receiver 306. The receiver 306 is coupled to the interconnect 106 via the interface 204. The interconnect 106 includes multiple lines that provide electrical communication between the interface 304 of the host device 104 and the interface 204 of the memory device 108. The lines of the interconnect 106 may correspond to data (DQ) lines, read strobe (RDQS) lines, clock (CK) lines, write clock (WCK) lines, write mask lines, or other memory communication lines. An LPDDR SDRAM, for example, may include data pins in accordance with one or more versions of the standard. The data pins depicted in FIG. 3 may comport, at least partially, with LPDDR5. Nonetheless, other implementations may have more pins, fewer pins, and/or different pins, as well as more lines, fewer lines, and/or different lines. In example operations, the receiver 306 of the memory device 108 receives information from the transmitter 302 over the interconnect 106 through the interface 204.

In FIG. 3, the host device 104 is depicted with the transmitter 302, and the memory device 108 is depicted with the receiver 306. However, either may have both a transmitter and a receiver. For example, the host device 104 may include circuitry similar to the receiver 306, and the memory device 108 may include circuitry similar to the transmitter 302. Such an implementation can provide bidirectional communication between the host device 104 and the memory device 108. Example implementations of the interface 204 are further described with respect to FIGS. 4-6. In general, the interface 304 of the host device 104 has a similar set of pins (e.g., a matching set of pins) as described with respect to the interface 204 of the memory device 108.

Figure 4:
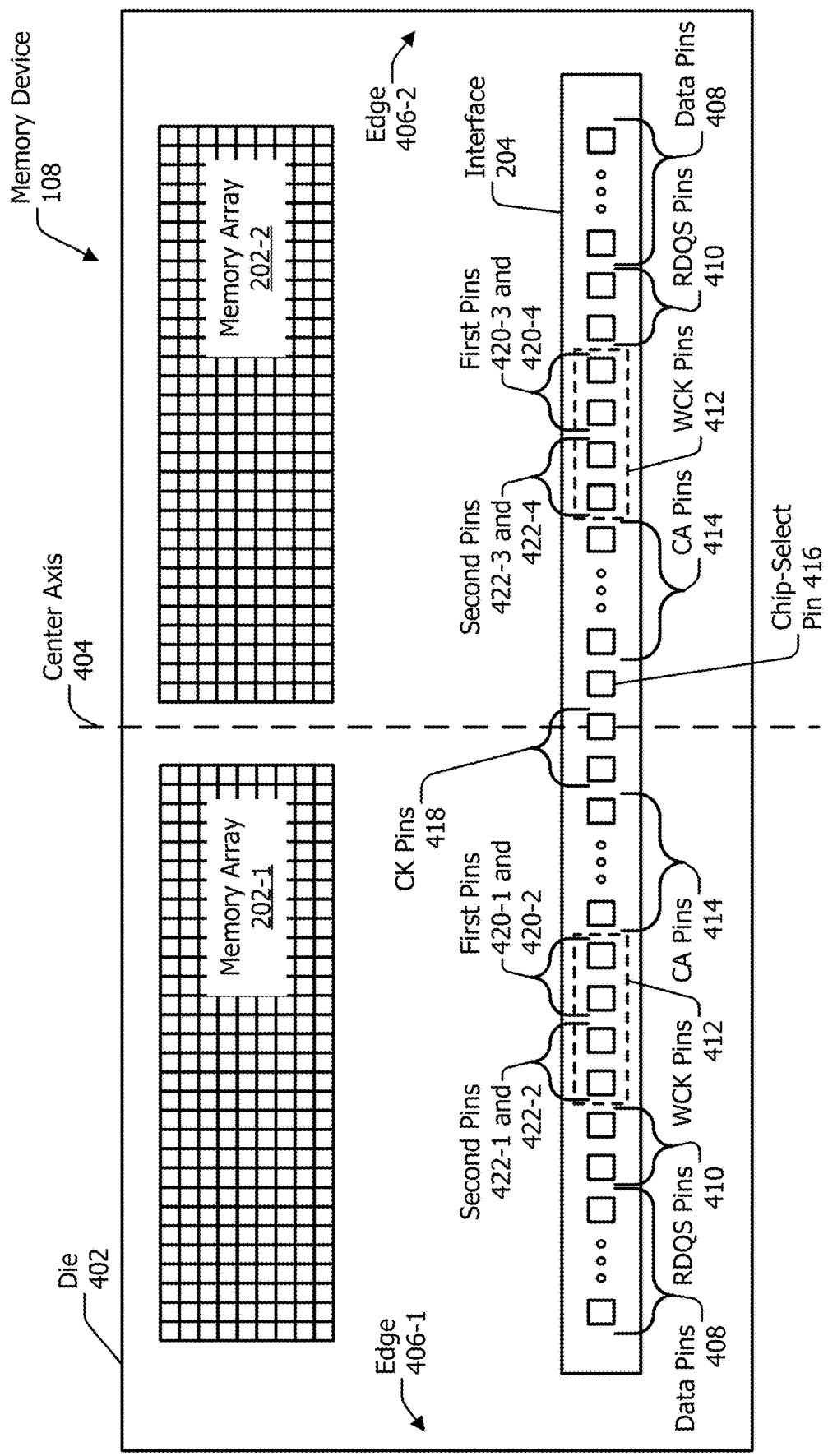
FIG. 4 illustrates an example memory device that can receive multiple differential write clock signals with different phases.

FIG. 4 illustrates an example memory device that can receive multiple differential write clock signals with different phases. In the depicted configuration, the memory device 108 is implemented on a die 402. A left side and a right side of the die 402 are identified by a center axis 404, which passes through a center of the die 402. The die 402 includes multiple edges. For example, the die 402 has an edge 406-1 (e.g., a left edge as depicted), which is to the left of the center axis 404. The die 402 also has an edge 406-2 (e.g., a right edge as depicted), which is to the right of the center axis 404.

The memory device 108 includes multiple memory arrays 202, such as two memory arrays 202-1 and 202-2. The memory array 202-1 is positioned on the left side of the die 402, and the memory array 202-2 is positioned on the right side of the die 402. The memory device 108 can process memory requests that involve joint operation or independent operation of the memory arrays 202-1 and 202-2. Although the memory device 108 is illustrated with two memory arrays in a particular physical arrangement, a memory device 108 can practice the techniques and/or incorporate the principles that are described herein with a different quantity of memory arrays or a different physical arrangement.

As illustrated, the interface 204 includes data pins 408, read data strobe pins 410 (RDQS pins 410), write clock pins 412 (WCK pins 412), command-and-address pins 414 (CA pins 414), a chip-select pin 416, and clock pins 418 (CK pins 418). In some implementations, the data pins 408 are coupled to the data bus 118 of the interconnect 106 and enable data to pass between the transmitter 302 and the receiver 306 during write or read operations. The write clock pins 412 can be coupled to a clock bus of the interconnect 106 and enable the memory device 108 to receive the first differential write clock signal 122-1 and the second differential write clock signal 122-2 from the memory controller 114. The command-and-address pins 414 can be coupled to the command-and-address bus 116 of the interconnect 106 and enable the memory device 108 to receive command-and-address signals from the memory controller 114. The clock pins 418 can be coupled to the clock bus of the interconnect 106 and enable the memory device 108 to receive the clock signal (e.g., the command-and-address clock) from the memory controller 114.

In this example, the command-and-address pins 414 are positioned more proximate to the center axis 404 than to the edges 406-1 or 406-2. In other words, the command-and-address pins 414 are positioned closer to the center axis 404 compared to either of the edges 406-1 to 406-2. To provide the flexibility of operating the memory arrays 202-1 and 202-2 jointly or separately, a first portion of the pins 408 to 412 are positioned on the left side of the die 402 (e.g., between the center axis 404 and the edge 406-1). Also, a second portion of the pins 408 to 412 are positioned on the right side of the die 402 (e.g., between the center axis 404 and the edge 406-2). In this way, the command-and-address pins 414 and the clock pins 418 are positioned between different sets of the write clock pins 412 (e.g., between a first set of write clock pins 412 positioned the left side and a second set of write clock pins 412 positioned on the right side).

The write clock pins 412 include first pins 420-1 to 420-4. A first set of the first pins 420 (e.g., pins 420-1 and 420-2) are positioned on the left. A second set of the first pins 420 (e.g., pins 420-3 and 420-4) are positioned on the right. The memory device 108 receives the first differential write clock signal 122-1 using the first pins 420-1 to 420-4.

The write clock pins 412 also include second pins 422-1 to 422-4. A first set of the second pins 422 (e.g., pins 422-1 and 422-2) are positioned on the left. A second set of the second pins 422 (e.g., pins 422-3 and 422-4) are positioned on the right. The memory device 108 receives the second differential write clock signal 122-2 using the second pins 422-1 to 422-4.

The memory device 108 can process a memory request associated with data presented at a first set of data pins 408 on the left using the write clock signals 122-1 and 122-2 received at a first set of write clock pins 412 on the left. Likewise, the memory device 108 can perform another memory operation associated with data presented at a second set of data pins 408 on the right using the write clock signals 122-1 and 122-2 received at the second set of write clock pins 412 on the right.

The memory controller 114 and the memory device 108 can perform write clock leveling to synchronize the differential write clock signals 122-1 and 122-2 received at the pins 420-1, 420-2, 422-1, and 422-2 with the differential write clock signals 122-1 and 122-2 received at the pins 420-3, 420-4, 422-3, and 422-4. Examples of write clock leveling are further described with respect to FIG. 8. Synchronizing the differential write clock signals 122-1 and 122-2 received at the different sets of write clock pins 412 enables pseudo channel operation of the memory arrays 202-1 and 202-2.

For clarity, the term "pins" is used herein to refer to electrical contacts or connections at the die 402 to enable communications with other dies, packages, and/or devices. Thus, a "pin" may include an electrical contact that extends through a plastic or other packaging, or a "pin" may correspond to or be used interchangeably with the term "pad" that is disposed on the die 402 (and may be covered by the packing). In some cases, the pins of the die 402—e.g., at the interface 204—may be physically positioned along a row or into linear arrangement, as shown in FIG. 4.

The interface 204 of FIG. 4 enables the memory arrays 202-1 and 202-2 to be jointly or independently operated at the cost of two sets of write clock pins 412. To reduce the quantity of pins within the interface 204, the clock pins 418 can be omitted, as further described with respect to FIG. 5.

Figure 5:
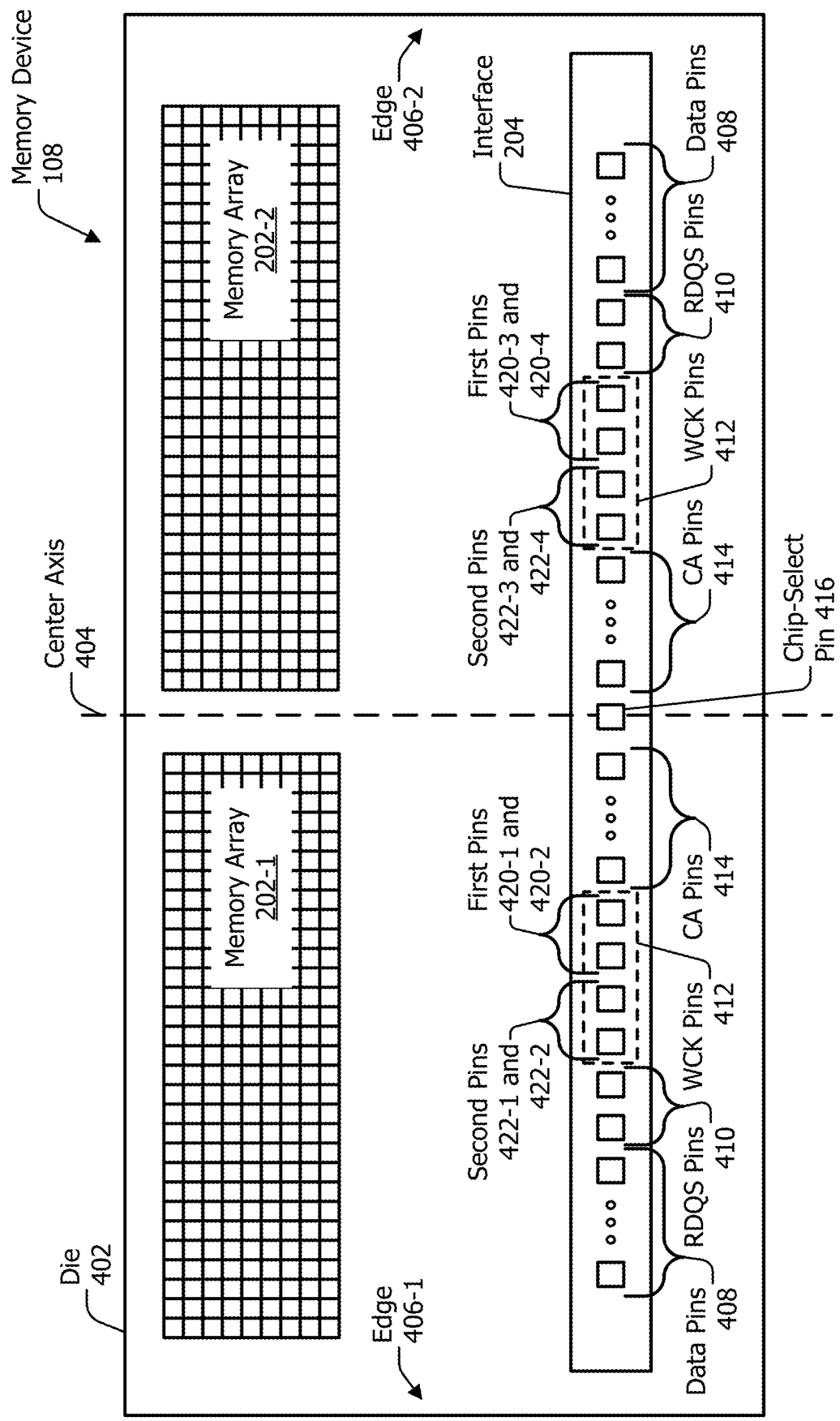
FIG. 5 illustrates another example memory device that can receive multiple differential write clock signals with different phases.

FIG. 5 illustrates another example memory device 108 that can receive multiple differential write clock signals with different phases. The interface 204 of FIG. 5 is similar to the interface 204 of FIG. 4, except the interface 204 of FIG. 5 does not include the clock pins 418 shown in FIG. 4. In this case, the first differential write clock signal 122-1 received at the first pins 420-1 and 420-2 acts as the clock signal or a reference clock signal. For example, the memory device 108 can use the first differential write clock signal 122-1 received at the first pins 420-1 and 420-2 to receive command-and-address signals received at the command-and-address pins 414.

The memory device 108 can also use the first differential write clock signal 122-1 at the first pins 420-1 and 420-2 as a reference signal for write clock leveling. In some aspects, the memory controller 114 and the memory device 108 perform write clock leveling to synchronize one or more of the differential write clock signals 122-1 and 122-2 received at the pins 420-1, 420-2, 422-1, and 422-2 with one or more of the corresponding differential write clock signals 122-1 and 122-2 received at the pins 420-3, 420-4, 422-3, and 422-4. Examples of write clock leveling are further described with respect to FIG. 8. Synchronizing the differential write clock signals 122-1 and 122-2 received at the different sets of write clock pins 412 enables pseudo channel operation of the memory arrays 202-1 and 202-2.

By omitting the clock pins 418, the memory device 108 of FIG. 5 can have fewer pins relative to the memory device 108 of FIG. 4. Another configuration of the memory device 108 can have fewer pins relative to the memory device 108 of FIG. 5, as further described with respect to FIG. 6.

Figure 6:
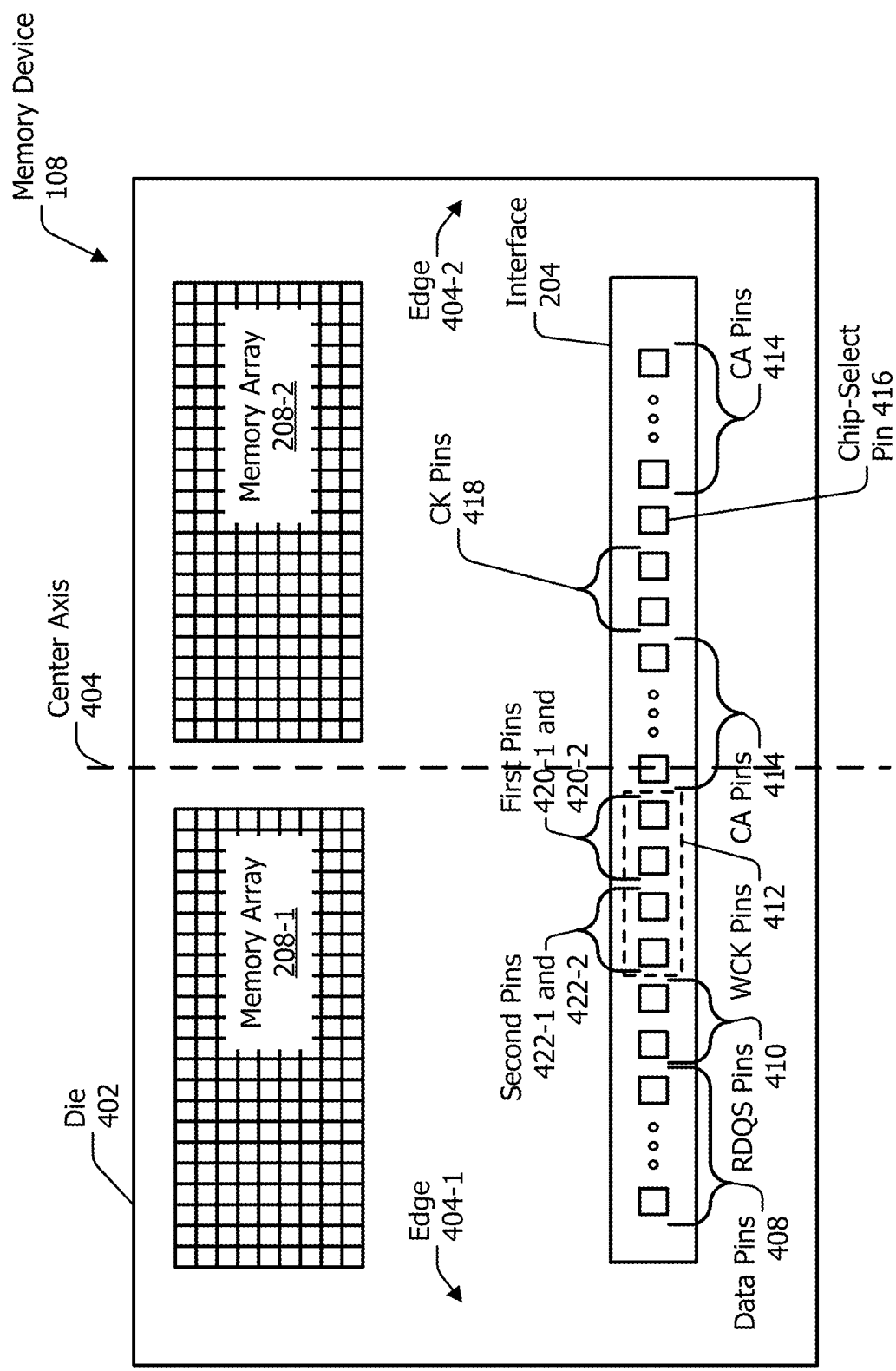
FIG. 6 illustrates yet another example memory device that can receive multiple differential write clock signals with different phases.

FIG. 6 illustrates yet another example memory device 108 that can receive multiple differential write clock signals with different phases. In the depicted configuration, a majority of the command-and-address pins 414 are positioned on one side of the die 402. In this example, a larger quantity of the command-and-address pins 414 are positioned on a right side of the center axis 404 (e.g., between the center axis 404 and the edge 404-2). As such, the command-and-address pins 414 are generally positioned more proximate to one of the edges 404 than to an opposite edge 404. For example, the command-and-address pins 414 shown in FIG. 6 are generally positioned closer to the edge 404-2 compared to the edge 404-1. In other words, the command-and-address pins 414 are positioned on one side of the write clock pins 412 (e.g., the right side).

In this case, the interface 204 includes four write clock pins 420-1, 420-2, 422-1, and 422-2 instead of the eight write clock pins 420-1 to 420-4 and 422-1 to 422-4 shown in FIGS. 4 and 5. In this way, the interface 204 of FIG. 6 can be implemented with fewer pins relative to the interfaces 204 of FIGS. 4 and 5. In some cases, the memory device 108 can be implemented on a smaller die due to the smaller quantity of pins, which are coupled to respective pads that are disposed on the die 402.

Figure 7:
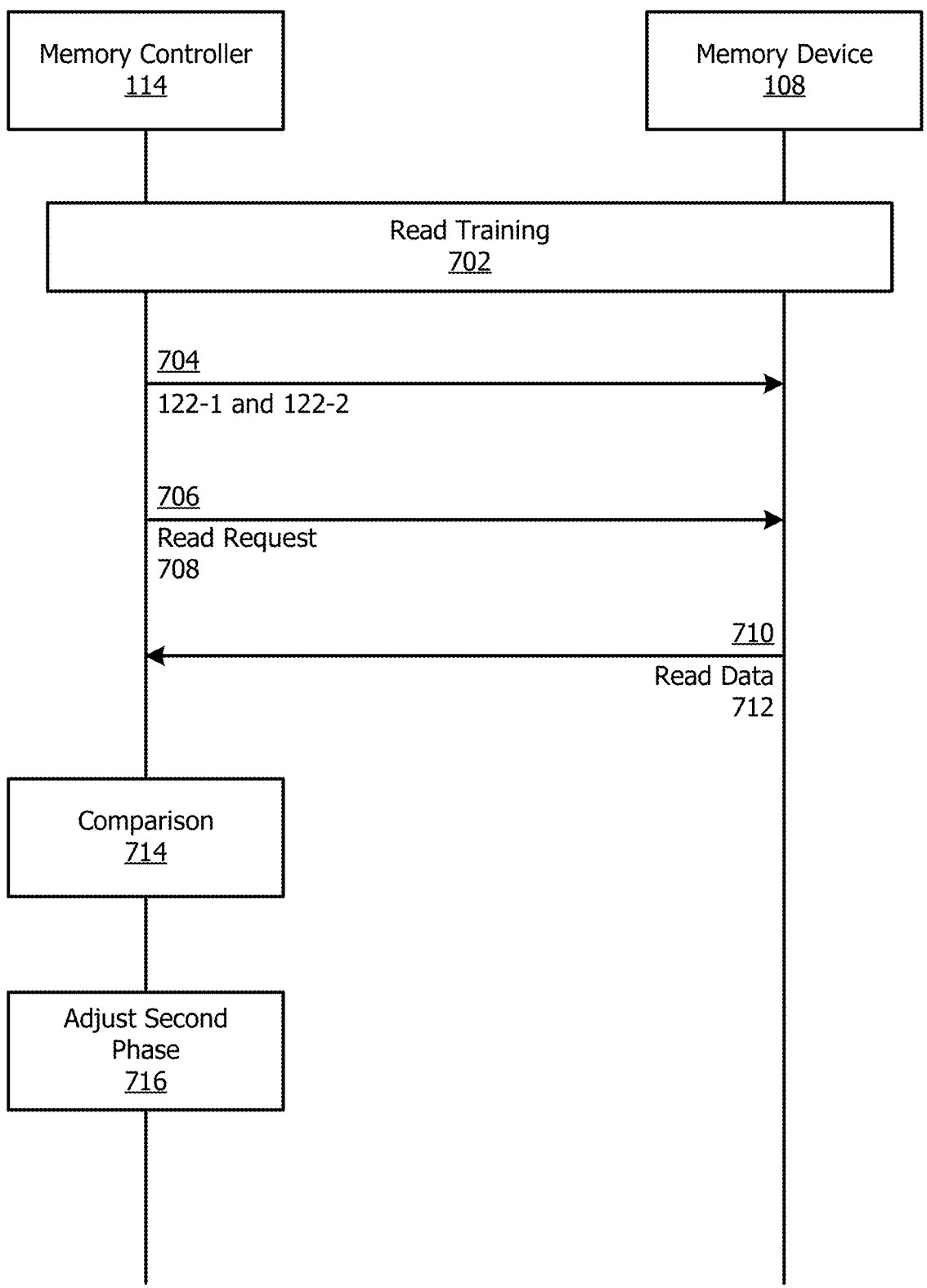
FIG. 7 illustrates example operations and signaling between a memory controller and a memory device to enable use of multiple differential write clock signals with different phases.

FIG. 7 illustrates example operations and signaling between the memory controller 114 and the memory device 108 to enable use of multiple differential write clock signals with different phases. At 702, the memory controller 114 and the memory device 108 perform read training. In some cases, the read training can be performed as part of read/write-based training. The read training enables the memory controller 114 to adjust the second phase 124-2 such that a phase offset between the first differential write clock signal 122-1 and the second differential write clock signal 122-2 is approximately 90 degrees. By performing the read training with the memory device 108, the memory controller 114 can maintain the 90-degree phase offset between the first and second differential write clock signals 122-1 and 122-2 without the use of additional complex or expensive circuitry.

As part of the read training, the memory controller 114 transmits, at 704, the differential write clock signals 122-1 and 122-2 to the memory device 108. The memory device 108 receives the differential write clock signals 122-1 and 122-2 at the write clock pins 412. At this point in time, as the read training is started, a difference between the first phase 124-1 and the second phase 124-2 may not be approximately 90 degrees. In other words, this difference may be less than or greater than 90 degrees by an amount that can negatively impact the memory device 108's ability to process memory requests or communicate with the memory controller 114.

At 706, the memory controller 114 transmits a read request 708 over the interconnect 106 to the memory device 108. The read request 708 commands the memory device 108 to read data from the memory array 202. In some cases, the memory controller 114 also transmits training data to the memory device 108. Transmission of the training data may precede that of the read request 708. The memory device 108 can receive the training data at the data pins 408 and write the training data to the memory array 202 using the differential write clock signals 122-1 and 122-2.

At 710, the memory device 108 transmits, using the data pins 408, read data 712 (e.g., data) over the interconnect 106 to the memory controller 114 in response to the read request 708. In particular, the memory device 108 uses the first differential write clock signal 122-1 and the second differential write clock signal 122-2 to generate a read data strobe (RDQS) signal, which controls a timing of the read data 712. In some cases, the read data 712 includes a non-inverted or an inverted version of the training data.

At 714, the memory controller 114 compares the read data 712 with "expected" data to detect any distortion caused by the phase offset between the first and second differential write clock signals 122-1 and 122-2 not being approximately equal to 90 degrees (e.g., not being between approximately 89 degrees and 91 degrees).

At 716, the memory controller 114 uses the clock circuitry 120 to adjust the second phase 124-2 based on the comparison at 714. For example, the memory controller 114 changes a phase delay associated with the second differential write clock signal 122-1 to cause the phase offset between the first and second differential write clock signals 122-1 and 122-2 to approach 90 degrees. By performing the read training, the memory controller 114 can maintain the 90-degree phase offset between the first differential write clock signal 122-1 and the second differential write clock signal 122-2. In some cases, the memory controller 114 can synchronize the first differential write clock signal 122-1 to a reference clock prior to performing the read training. This synchronization is further described with respect to FIG. 8.

Figure 8:
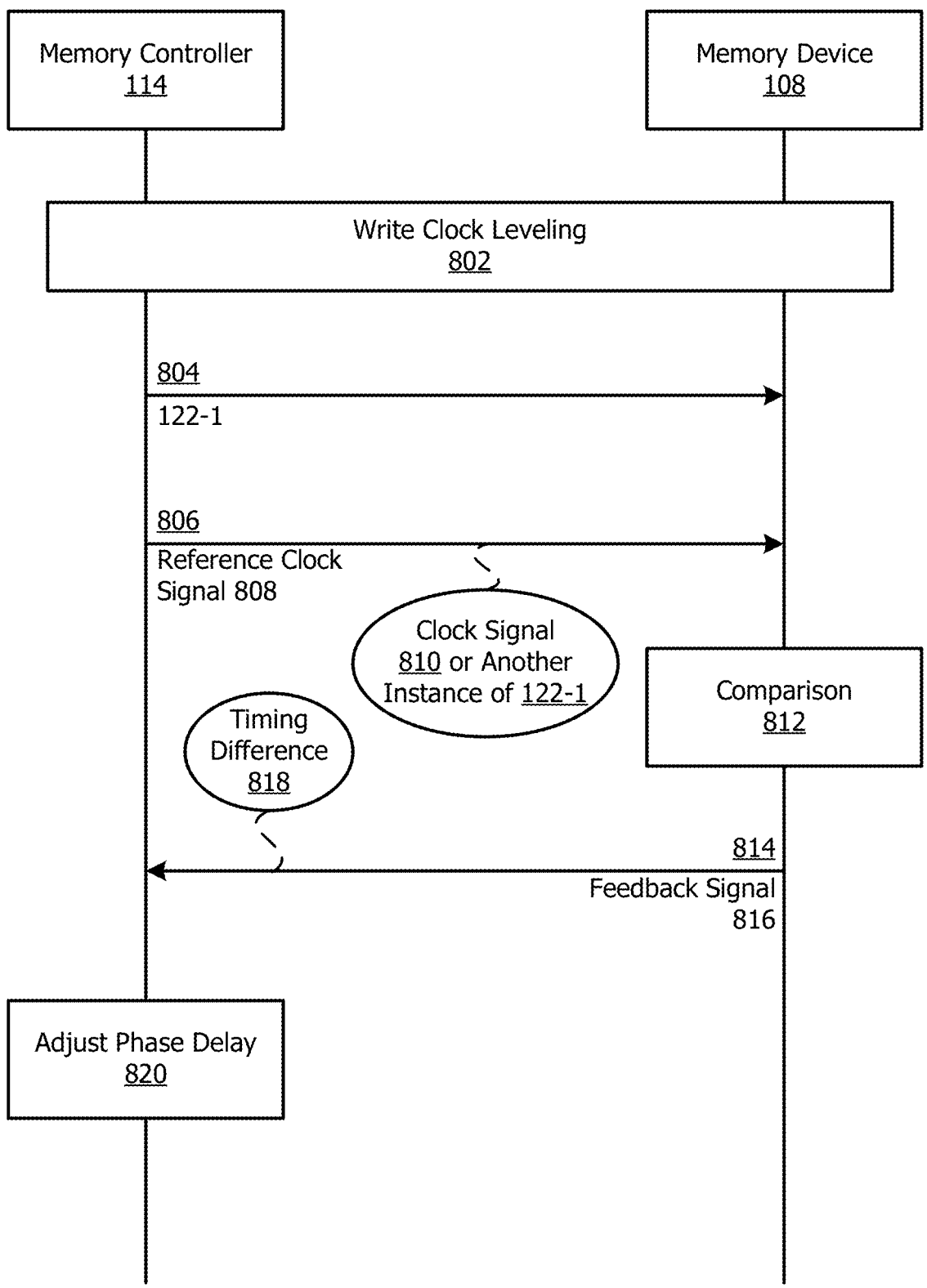
FIG. 8 illustrates other example operations and signaling between a memory controller and a memory device to enable use of multiple differential write clock signals with different phases.

FIG. 8 illustrates other example operations and signaling between the memory controller 114 and the memory device 108 to enable use of multiple differential write clock signals with different phases. At 802, the memory controller 114 and the memory device 108 perform write clock leveling (or leveling). The write clock leveling enables the memory controller 114 to align a rising edge of the first differential write clock signal 122-1 with a rising edge of a reference clock. In this way, the write clock leveling can synchronize the first differential write clock signal 122-1 with the reference clock.

As part of the write clock leveling, the memory controller 114 transmits, at 804, the first differential write clock signal 122-1 over the interconnect 106 to the memory device 108. The memory device 108 receives the first differential write clock signal 122-1 at the write clock pins 412. For example, the memory device 108 can receive the first differential write clock signal 122-1 at the first pins 420-1 and 420-2 in FIGS. 4 and 6. As another example, the memory device 108 can receive the first differential write clock signal 122-1 at the first pins 420-3 and 420-4 in FIG. 5.

At 806, the memory controller 114 transmits a reference clock signal 808 over the interconnect 106 to the memory device 108. Although shown separately, in some aspects the first differential write clock signal 122-1 and the reference clock signal 808 can be transmitted during a same time interval. In some implementations, the reference clock signal 808 represents a clock signal 810 (e.g., a command-and-address clock signal), which is received at the clock pins 418 in FIG. 6. In other implementations, the reference clock signal 808 represents another instance of the first differential write clock signal 122-1, which is provided at other write clock pins 412 of the memory device 108. Consider the two sets of write clock pins 412 in FIGS. 4 and 5. In this case, the first differential write clock signal 122-1 received at the first pins 420-1 and 420-2 represents the reference clock signal 808, and the first differential write clock signal 122-1 received at the first pins 420-3 and 420-4 represents the signal whose timing the memory controller 114 will adjust to achieve synchronization.

At 812, the memory device 108 compares the rising edge of the first differential write clock signal 122-1 to the rising edge of the reference clock signal 808. In particular, the clock circuitry 212 of the memory device 108 can detect whether the rising edge of the first differential write clock signal 122-1 is earlier or later than the rising edge of the reference clock signal 808.

At 814, the memory device 108 transmits, using the data pins 408, a feedback signal 816 over the interconnect 106 to the memory controller 114. The feedback signal 816 includes information determined from the comparison at 812. For example, the feedback signal 816 includes an indication of a timing difference 818 between the rising edge of the first differential write clock signal 122-1 and the rising edge of the reference clock signal 808.

At 820, the memory controller 114 adjusts a phase delay associated with the first differential write clock signal 122-1. For example, the memory controller 114 can increase or decrease the phase delay associated with the first differential write clock signal 122-1 to synchronize the first differential write clock signal 122-1 to the reference clock signal 808.

The read training at 702 and the write clock leveling at 802 can be performed as part of a training operation. In an example training operation, the memory controller 114 and the memory device 108 perform command-bus training (CBT) prior to performing the write clock leveling. Additionally, the memory controller 114 and the memory device 108 can also perform the read training after the write clock leveling.

Example Methods

Figure 9:
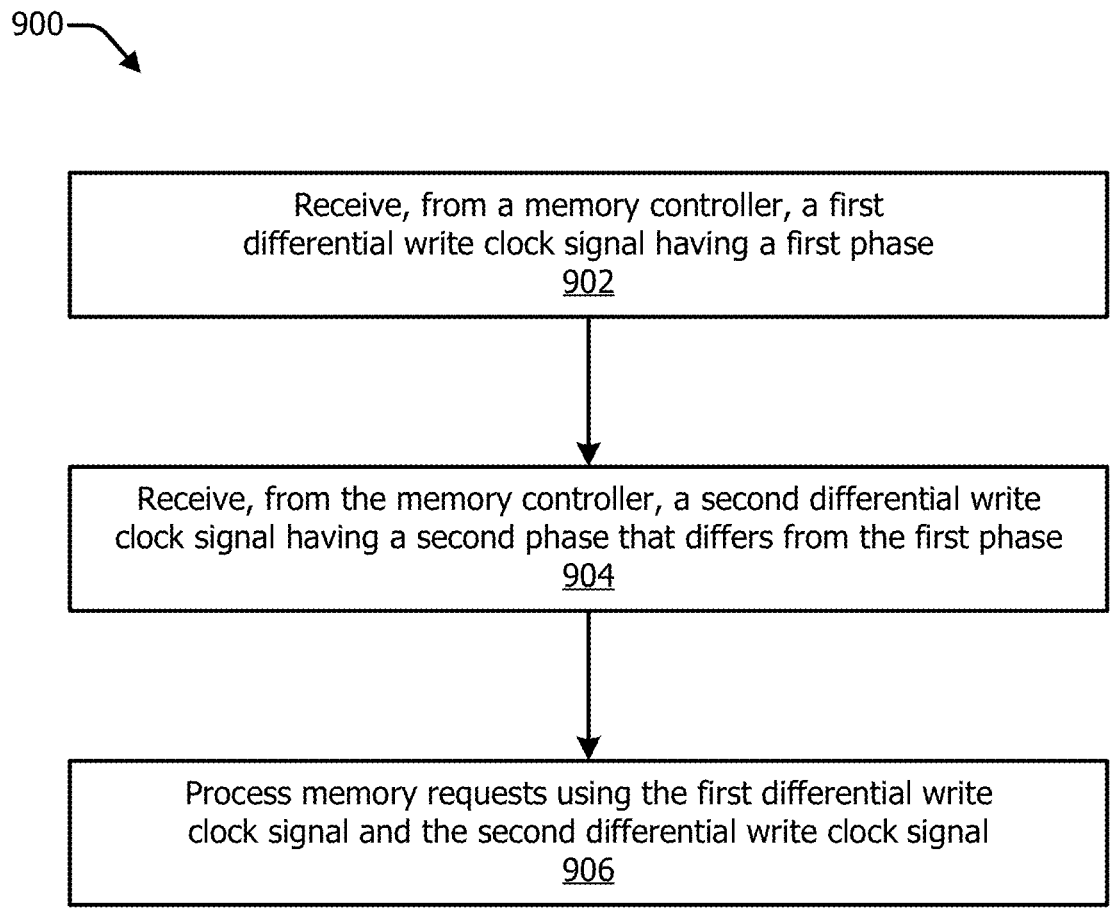
FIG. 9 illustrates an example method for using multiple differential write clock signals with different phases.
Figure 10:
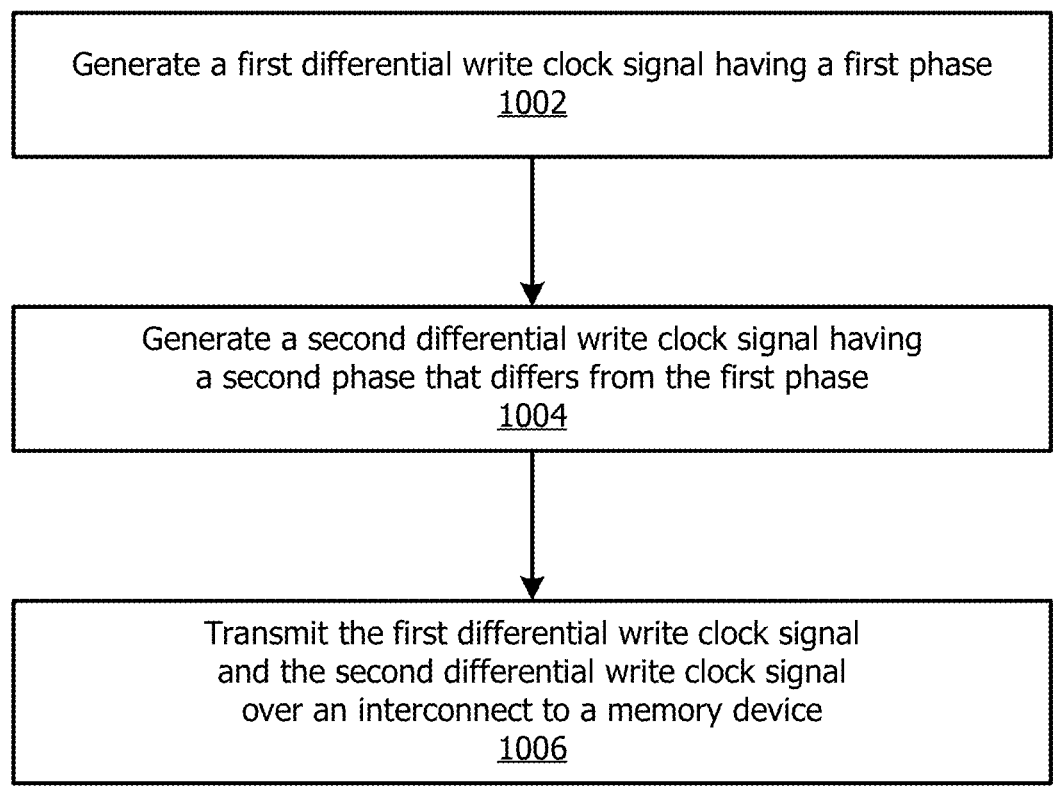
FIG. 10 illustrates another example method for using multiple differential write clock signals with different phases.

This section describes example methods for using multiple differential write clock signals having different phases with reference to the flow charts and flow diagrams of FIGS. 9 and 10. These descriptions may also refer to components, entities, and other aspects depicted in FIGS. 1-6 by way of example only. The described methods are not necessarily limited to performance by one entity or multiple entities operating on one device.

FIG. 9 illustrates a flow diagram 900, which includes operations 902 through 906. These operations can be performed by a memory device 108 to implement aspects of using multiple differential write clock signals having different phases. At 902, a first differential write clock signal having a first phase is received from a memory controller. In aspects, the memory device 108 receives, at the first pins 420, the first differential write clock signal 122-1. The first differential write clock signal 122-1 has a first phase 124-1 and is composed of two complementary signals. One of these complementary signals has the first phase 124-1, and another of these complementary signals has a third phase that is approximately 180 degrees offset from the first phase 124-1.

At 904, a second differential write clock signal having a second phase that differs from the first phase is received from the memory controller. For example, the memory device 108 receives, at the second pins 422, the second differential write clock signal 122-2. The second differential write clock signal 122-2 has the second phase 124-2, which differs from the first phase 124-1. For example, the second phase 124-2 can differ from the first phase 124-1 by approximately 90 degrees. The second differential write clock signal 122-2 is composed of two complementary signals. One of these complementary signals has the second phase 124-2, and another of these complementary signals has a fourth phase that is approximately 180 degrees offset from the second phase 124-2.

At 906, memory operations are processed using the first differential write clock signal and the second differential write clock signal. For example, the memory device 108 processes a write request using the timing provided by the first differential write clock signal 122-1 and the second differential write clock signal 122-2. In particular, the memory device 108 samples, responsive to the first differential write clock signal 122-1 and the second differential write clock signal 122-2, data signals provided at the data pins 408. Additionally or alternatively, the memory device 108 processes a read request 708 using the timing provided by the first differential write clock signal 122-1 and the second differential write clock signal 122-2. For example, the memory device 108 generates a read data strobe signal (e.g., a read clock signal) based on the first differential write clock signal 122-1 and the second differential write clock signal 122-2. The read data strobe signal controls the timing of data that the memory device 108 transmits to the memory controller 114 as part of the read request.

FIG. 10 illustrates a flow diagram 1000, which includes operations 1002 through 1006. These operations can be performed by a memory controller 114 (e.g., of a host device 104) to implement aspects of using multiple differential write clock signals having different phases.

At 1002, a first differential write clock signal having a first phase is generated. For example, the clock circuitry 120 of the memory controller 114 generates the first differential write clock signal 122-1, as shown in FIG. 1. The first differential write clock signal 122-1 has the first phase 124-1.

At 1004, a second differential write clock signal having a second phase that differs from the first phase is generated. For example, the clock circuitry 120 of the memory controller 114 generates the second differential clock signal 122-2, as shown in FIG. 1. The second differential write clock signal 122-2 has the second phase 124-2, which differs from the first phase 124-1. For example, the second phase 124-2 can differ from the first phase 124-1 by approximately 90 degrees. In some implementations, the clock circuitry 120 generates the second differential clock signal 122-2 based on the first differential write clock signal 122-1. For example, the clock circuitry 120 can apply a phase delay to the first differential write clock signal 122-1 to generate the second differential clock signal 122-2.

At 1006, the first differential write clock signal and the second differential write clock signal are transmitted over an interconnect to a memory device. For example, the memory controller 114 transmits the first differential write clock signal 122-1 and the second differential write clock signal 122-2 over the interconnect 106 to the memory device 108, as shown in FIG. 1. By having the memory controller 114 generate the first differential write clock signal 122-1 and the second differential write clock signal 122-2 for the memory device 108, the memory device 108 can be implemented without some components, such as a clock divider circuit, which may enter a metastable state.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods or operations may be implemented in, for example, hardware (e.g., fixed-logic circuitry or a processor in conjunction with a memory), firmware, or some combination thereof. The methods may be realized using one or more of the apparatuses, systems, or components shown in FIGS. 1-6, the components of which may be further divided, combined, rearranged, and so on. The devices, systems, and components of these figures generally represent firmware, such as executable-code or the actions thereof; hardware, such as electronic devices, packaged modules, IC chips, or circuits; software, such as processor-executable instructions; or a combination thereof. The illustrated apparatuses 102 and components of 200, include, for instance, a memory controller 114, an interconnect 106, and a memory device 108. FIGS. 1-6 illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of using multiple differential write clock signals having different phases have been described in language specific to certain features and/or methods, the subject of the appended claims is not necessarily limited to the specific features or methods described. Rather, the specific features and methods are disclosed as a variety of example implementations of using multiple differential write clock signals having different phases.

What is claimed is:

1. An apparatus comprising:
   at least one memory array; and
   an interface coupled to the at least one memory array and configured to be coupled to a memory controller via an interconnect, the interface comprising:
      at least one set of first pins configured to receive, from the memory controller, a first differential write clock signal that passes through the interconnect, the first differential write clock signal comprising a first signal having a first phase and a second signal having a second phase that differs from the first phase by approximately 180 degrees; and
      at least one set of second pins configured to receive, from the memory controller, a second differential write clock signal that passes through the interconnect, the second differential write clock signal comprising a third signal having a third phase that differs from the first phase and a fourth signal having a fourth phase that differs from the third phase by approximately 180 degrees.

2. The apparatus of claim 1, wherein the third phase differs from the first phase by approximately ninety degrees.

3. The apparatus of claim 2, wherein a difference between the third phase and the first phase is between approximately 89 and 91 degrees.

4. The apparatus of claim 2, wherein the third phase differs from the first phase by approximately ninety degrees to enable the apparatus to communicate with the memory controller.

5. The apparatus of claim 1, further comprising:
   logic circuitry coupled to the at least one memory array and the interface, the logic circuitry configured to:
      communicate with the at least one memory array and the interface; and
      process memory requests using the first differential write clock signal and the second differential write clock signal.

6. The apparatus of claim 1, wherein frequencies of the first differential write clock signal and the second differential write clock signal are substantially similar.

7. The apparatus of claim 1, wherein:
   the at least one set of first pins is configured to receive, from the memory controller, the first signal of the first differential write clock signal and the second signal of the first differential write clock signal that pass through the interconnect; and
   the at least one set of second pins is configured to receive, from the memory controller, the first signal of the second differential write clock signal and the second signal of the second differential write clock signal that pass through the interconnect.

8. The apparatus of claim 1, further comprising logic circuitry coupled to the at least one memory array and the interface, the logic circuitry configured to:
   process a read request using the first differential write clock signal and the second differential write clock signal, the read request associated with a training operation; and
   transmit, through the interface, data associated with the read request over the interconnect to the memory controller.

9. The apparatus of claim 8, wherein the logic circuitry is further configured to receive, from the memory controller, another second differential write clock signal through the interconnect, the other second differential write clock signal having an adjusted phase delay based on transmission of the data.

10. The apparatus of claim 1, wherein:
    the at least one set of first pins comprises a first set of first pins and a second set of first pins;
    the at least one set of second pins comprises a first set of second pins and a second set of second pins;
    the interface comprises third pins configured to be coupled to a command-and-address bus of the interconnect;
    the third pins are positioned between the first set of first pins and the second set of first pins; and
    the third pins are positioned between the first set of second pins and the second set of second pins.

11. The apparatus of claim 10, wherein the interface comprises:
    a first set of fourth pins configured to be coupled to a data bus of the interconnect, the first set of fourth pins positioned closer to the first set of first pins than the second set of first pins and positioned closer to the first set of second pins than the second set of second pins; and
    a second set of fourth pins configured to be coupled to the data bus of the interconnect, the second set of fourth pins positioned closer to the second set of first pins than the first set of first pins and positioned closer to the second set of second pins than the first set of second pins.

12. The apparatus of claim 11, further comprising logic circuitry coupled to the at least one memory array and the interface, the logic circuitry configured to:
    process a memory request associated with data presented at the first set of fourth pins using the first differential write clock signal received at the first set of first pins and the second differential write clock signal received at the first set of second pins; and
    process another memory request associated with other data presented at the second set of fourth pins using the first differential write clock signal received at the second set of first pins and the second differential write clock signal received at the second set of second pins.

13. The apparatus of claim 12, wherein the logic circuitry is configured to perform a leveling operation with the memory controller to synchronize the first differential write clock signal received at the first set of first pins with the first differential write clock signal received at the second set of first pins.

14. The apparatus of claim 13, wherein the logic circuitry is configured to:
    compare a rising edge of the first differential write clock signal received at the first set of pins to a rising edge of the first differential write clock signal received at the second set of first pins; and transmit, through the interface, a feedback signal to the memory controller, the feedback signal comprising an indication of a timing difference between the first differential write clock signal received at the first set of first pins and the first differential write clock signal received at the second set of first pins.

15. The apparatus of claim 11, wherein:
the interface comprises at least one fifth pin configured to receive, from the memory controller, a clock signal that passes through the interconnect;
the at least one fifth pin is positioned between the first set of first pins and the second set of first pins; and
the at least one fifth pin is positioned between the first set of second pins and the second set of second pins.

16. The apparatus of claim 15, wherein the clock signal has a frequency that differs from a frequency of the first differential write clock signal and from a frequency of the second differential write clock signal.

17. The apparatus of claim 15, further comprising logic circuitry coupled to the at least one memory array and the interface, the logic circuitry configured to receive command-and-address signals at the third pins using the clock signal.

18. The apparatus of claim 10, further comprising logic circuitry coupled to the at least one memory array and the interface, the logic circuitry configured to receive command-and-address signals at the third pins using the first differential clock signal received at the first set of first pins.

19. The apparatus of claim 1, wherein the interface comprises:
third pins configured to be coupled to a command-and-address bus of the interconnect, the third pins positioned on a same side of the at least one set of first pins and the at least one set of second pins; and
at least one fifth pin configured to receive, from the memory controller, a clock signal that passes through the interconnect.

20. The apparatus of claim 19, wherein:
the at least one set of first pins comprises a single set of first pins; and
the at least one set of second pins comprises a single set of second pins.

21. The apparatus of claim 19, further comprising logic circuitry coupled to the at least one memory array and the interface, the logic circuitry configured to perform a leveling operation with the memory controller to synchronize the first differential write clock signal received at the first set of first pins with the clock signal received at the at least one fifth pin.

22. The apparatus of claim 1, further comprising at least one memory device, the at least one memory device comprising the at least one memory array and the interface.

23. A method comprising:
receiving, from a memory controller, a first differential write clock signal comprising a first signal having a first phase and a second signal having a second phase that differs from the first phase by approximately 180 degrees;
receiving, from the memory controller, a second differential write clock signal comprising a third signal having a third phase that differs from the first phase and a fourth signal having a fourth phase that differs from the third phase by approximately 180 degrees; and
processing memory requests using the first differential write clock signal and the second differential write clock signal.

24. The method of claim 23, wherein the third phase differs from the first phase by approximately ninety degrees.

25. The method of claim 24, further comprising:
processing a read request using the first differential write clock signal and the second differential write clock signal, the read request associated with a training operation;
transmitting data associated with the read request to the memory controller; and
receiving, from the memory controller, another second differential write clock signal, the other second differential write clock signal having an adjusted phase delay based on transmission of the data.

26. The method of claim 23, further comprising performing a leveling operation with the memory controller to synchronize the first differential write clock signal to a reference clock signal.

27. The method of claim 26, wherein the clock signal comprises a command-and-address clock signal or another instance of the first differential write clock signal.

28. An apparatus comprising:
an interface configured to be coupled to a memory device via an interconnect; and
clock circuitry coupled to the interface and configured to:
generate a first differential write clock signal comprising a first signal having a first phase and a second signal having a second phase that differs from the first phase by approximately 180 degrees;
generate a second differential write clock signal comprising a third signal having a third phase that differs from the first phase by approximately ninety degrees and a fourth signal having a fourth phase that differs from the third phase by approximately 180 degrees; and
transmit, through the interface, the first differential write clock signal and the second differential write clock signal over the interconnect to the memory device.

29. The apparatus of claim 28, wherein the third phase differs from the first phase by approximately ninety degrees.

30. The apparatus of claim 28, wherein the clock circuitry is configured to:
receive, through the interface, data from the memory device, the data associated with a read request; and
adjust, based on the data, a phase delay associated with the second differential write clock signal to cause the third phase to differ from the first phase by approximately ninety degrees.

31. The apparatus of claim 28, wherein the clock circuitry is configured to:
transmit, through the interface, a reference clock signal over the interconnect to the memory device;
receive, from the memory device, an indication of a timing difference between the first differential write clock signal and a reference clock signal; and
adjust a phase delay associated with the first differential write clock signal to synchronize the first differential write clock signal with the reference clock signal.

32. The apparatus of claim 28, wherein:
the apparatus comprises a host device including a memory controller; and
the memory controller comprises the clock circuitry.

33. A method comprising:
generating a first differential write clock signal comprising a first signal having a first phase and a second signal having a second phase that differs from the first phase by approximately 180 degrees;

generating a second differential write clock signal comprising a third signal having a third phase that differs from the first phase and a fourth signal having a fourth phase that differs from the third phase by approximately 180 degrees; and transmitting the first differential write clock signal and the second differential write clock signal over an interconnect to a memory device.

34. The method of claim 33, wherein the third phase differs from the first phase by approximately ninety degrees.

35. The method of claim 33, further comprising:
receiving data from the memory device, the data associated with a read request; and
adjusting, based on the data, a phase delay associated with the second differential write clock signal to cause the third phase to differ from the first phase by approximately ninety degrees.

36. The method of claim 33, further comprising:
transmitting a reference clock signal over the interconnect to the memory device;
receiving, from the memory device, an indication of a timing difference between the first differential write clock signal and the reference clock signal; and
adjusting a phase delay associated with the first differential write clock signal to synchronize the first differential write clock signal with the reference clock signal.

* * * * *